United States Patent
Ye et al.

(10) Patent No.: US 12,066,460 B2
(45) Date of Patent: Aug. 20, 2024

(54) METHOD AND APPARATUS FOR TESTING SEMICONDUCTOR DEVICE

(71) Applicant: Yangtze Memory Technologies Co., Ltd., Wuhan (CN)

(72) Inventors: Benfei Ye, Wuhan (CN); Zhengpeng Zhu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 17/749,632

(22) Filed: May 20, 2022

(65) Prior Publication Data
US 2023/0375595 A1    Nov. 23, 2023

(51) Int. Cl.
*G01R 1/067*    (2006.01)
*G01B 7/31*    (2006.01)

(52) U.S. Cl.
CPC .......... *G01R 1/06794* (2013.01); *G01B 7/31* (2013.01)

(58) Field of Classification Search
None
See application file for complete search history.

(56) References Cited

U.S. PATENT DOCUMENTS

| | | | |
|---|---|---|---|
| 2013/0249584 A1* | 9/2013 | Lou ..................... | G01R 1/07342 324/755.07 |
| 2015/0109013 A1* | 4/2015 | Chang ................ | G01R 31/2884 324/754.03 |
| 2015/0130498 A1* | 5/2015 | Wang ................. | G01R 1/07307 324/756.03 |
| 2017/0108547 A1* | 4/2017 | Appinger ........... | G01R 31/2891 |
| 2019/0064217 A1* | 2/2019 | Pu ....................... | G01R 1/06722 |

* cited by examiner

*Primary Examiner* — Nasima Monsur
(74) *Attorney, Agent, or Firm* — Anova Law Group, PLLC

(57) ABSTRACT

A method for testing a semiconductor device comprises obtaining an alignment signal between one or more auxiliary pins of a test probe and one or more auxiliary pads of a test key of the semiconductor device before a probing test of the semiconductor device. The obtaining of the alignment signal comprises: performing a vertical alignment between the one or more auxiliary pins of the test probe and the one or more auxiliary pads of the test key; and gradually reducing a vertical distance between the one or more auxiliary pins of the test probe and the one or more auxiliary pads of the test key for bringing into an electrical contact until the alignment signal there-between satisfies an alignment condition.

16 Claims, 5 Drawing Sheets

Dual column        Single column

Dual column        Single column

Normal    Abnormal

METHOD AND APPARATUS FOR TESTING SEMICONDUCTOR DEVICE

TECHNICAL FIELD

The present disclosure relates to the technical field of semiconductor device testing and, more particularly, to a method and an apparatus for testing a semiconductor device.

BACKGROUND

After a semiconductor device is formed, a test probe is often used to connect to the semiconductor device to inspect electrical characteristics of the semiconductor device. The test probe includes a plurality of test pins. The semiconductor device includes a test key. The test key includes a plurality of test pads corresponding to the plurality of test pins of the test probe. After the test probe is moved to contact with the test key, the plurality of test pins is aligned with the plurality of test pads formed on the semiconductor device to make electrical connections. To effectively inspect the electrical characteristics of the semiconductor device and avoid damaging the semiconductor, each of the plurality of test pins of the test probe needs to have a good contact with a corresponding test pad of the test key on the semiconductor device.

SUMMARY

One aspect of the present disclosure provides a method for testing a semiconductor device. The method comprises obtaining an alignment signal between one or more auxiliary pins of a test probe and one or more auxiliary pads of a test key of the semiconductor device before a probing test of the semiconductor device. The obtaining of the alignment signal comprises: performing a vertical alignment between the one or more auxiliary pins of the test probe and the one or more auxiliary pads of the test key; and gradually reducing a vertical distance between the one or more auxiliary pins of the test probe and the one or more auxiliary pads of the test key for bringing into an electrical contact until the alignment signal there-between satisfies an alignment condition.

Another aspect of the present disclosure provides an apparatus for testing a semiconductor device. The apparatus comprises: a test probe comprising one or more auxiliary pins, and a controller configured to obtain an alignment signal between the test probe and the semiconductor device before a probing test of the semiconductor device, wherein the controller is configured, through a driving mechanism of the test probe and/or a device holder for holding and moving the semiconductor device, to cause: a vertical alignment between the one or more auxiliary pins and one or more auxiliary pads of a test key of the semiconductor device; and a gradual reduction of a vertical distance between the one or more auxiliary pins and the one or more auxiliary pads for bringing into an electrical contact until the alignment signal there-between satisfies an alignment condition.

Another aspect of the present disclosure provides a non-transitory computer-readable storage medium storing a computer program. A processor of a controller of an apparatus for testing a semiconductor device executes the computer program to obtain an alignment signal between one or more auxiliary pins of a test probe and one or more auxiliary pads of a test key of the semiconductor device before a probing test of the semiconductor device. The processor is further configured to execute the computer program to: perform a vertical alignment between the one or more auxiliary pins of the test probe and the one or more auxiliary pads of the test key; and gradually reduce a vertical distance between the one or more auxiliary pins of the test probe and the one or more auxiliary pads of the test key for bringing into an electrical contact until the alignment signal there-between satisfies an alignment condition.

BRIEF DESCRIPTION OF THE DRAWINGS

To more clearly illustrate the technical solution in embodiments of the present disclosure, the accompanying drawings used in the description of the disclosed embodiments are briefly described hereinafter. The drawings described below are merely some embodiments of the present disclosure. Other drawings may be derived from such drawings by a person with ordinary skill in the art without creative efforts and may be encompassed in the present disclosure.

DETAILED DESCRIPTION OF THE EMBODIMENTS

Technical solutions in the embodiments of the present disclosure will be clearly described below with reference to the accompanying drawings. It will be appreciated that the described embodiments are some rather than all of the embodiments of the present disclosure. Other embodiments obtained by those having ordinary skills in the art on the basis of the described embodiments without inventive efforts should fall within the scope of the present disclosure.

Embodiments of the present disclosure will be described in detail in connection with the drawings. Under circumstances of no conflict, the following embodiments and features in the embodiments may be combined with each other.

The present disclosure may be applied to test a semiconductor device. The semiconductor device may be formed on a wafer. When only one semiconductor device is described in various embodiments of the present disclosure, a plurality of semiconductor devices may be formed on the wafer, and the same method for testing one semiconductor may be applied to test the plurality of semiconductor devices.

After the semiconductor device is formed on the wafer, the wafer will be loaded onto a testing apparatus, where a test probe contacts with a test key of the semiconductor device to test electrical characteristics of the semiconductor device. When an alignment between the test probe and the test key cannot be verified before the testing is performed, it is hard to determine whether a failed test result is caused by a misalignment between the test probe and the test key or a faulty semiconductor device. In case the testing fails, the alignment between the test probe and the test key is often manually checked by examining pins of the test probe and pin scratches on test pads of the test key. Manually checking the alignment between the test probe and the test key after the testing fails is inefficient and inaccurate. Further, testing the semiconductor device while the test probe and the test key are not aligned with each other may damage the semiconductor device. Thus, before the testing is performed, the alignment between the test probe and the test key needs to be verified to prevent the semiconductor device from being damaged by the misalignment between the test probe and the test key of the semiconductor device.

Figure 1A:
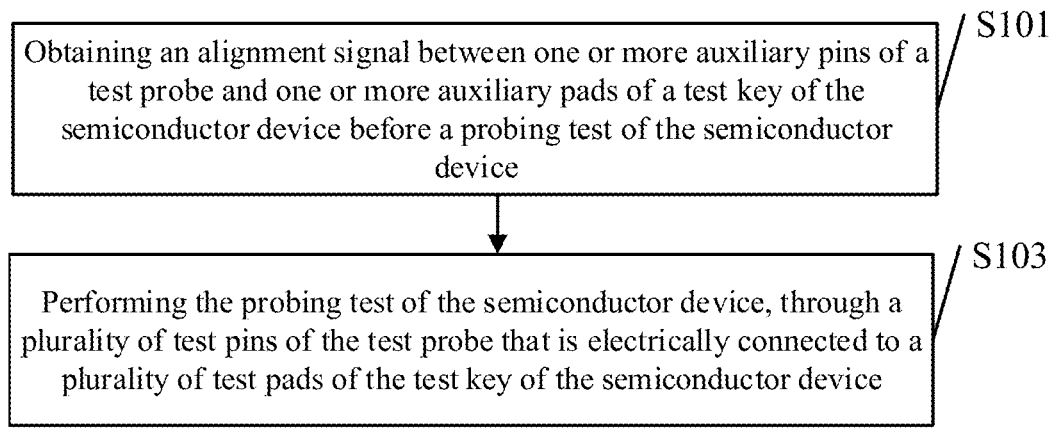
FIG. 1A is a schematic flowchart of an exemplary method for testing a semiconductor device according to some embodiments of the present disclosure.

The present disclosure provides a method for testing a semiconductor device. FIG. 1A is a schematic flowchart of an exemplary method for testing a semiconductor device according to some embodiments of the present disclosure. As shown in FIG. 1A, the method includes obtaining an alignment signal between one or more auxiliary pins of a test probe and one or more auxiliary pads of a test key of the semiconductor device (S101).

Figure 2:
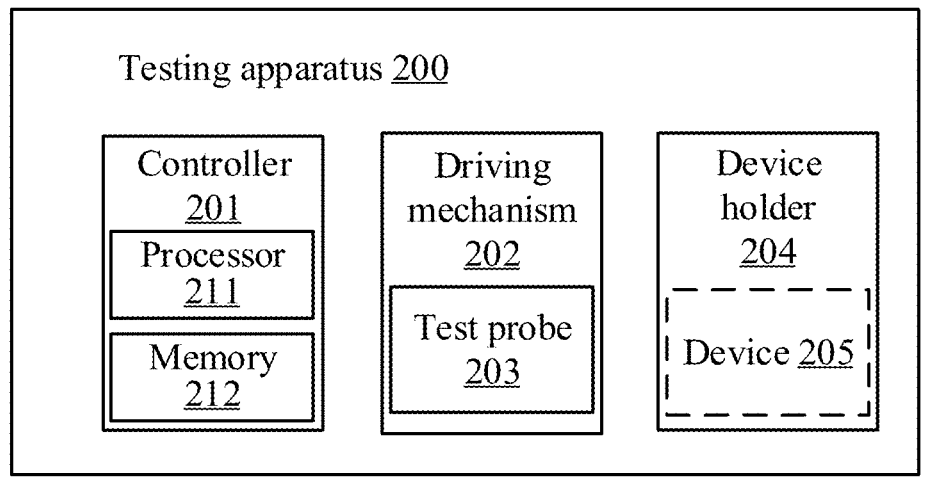
FIG. 2 is a schematic structural diagram of an exemplary apparatus for testing the semiconductor device according to some embodiments of the present disclosure.

In some embodiments, the method for testing the semiconductor is performed by a controller of an apparatus for testing the semiconductor device. FIG. 2 is a schematic structural diagram of an exemplary apparatus for testing the semiconductor device according to some embodiments of the present disclosure. The apparatus for testing the semiconductor device is also called a testing apparatus. As shown in FIG. 2, the testing apparatus 200 includes a controller 201, a test probe 203, a driving mechanism 202 configured to move the test probe 203, and a device holder 204 configured to hold and move a semiconductor device 205.

In some embodiments, as shown in FIG. 2, the controller 201 further includes a processor 211 and a memory 212. The processor 211 of the controller 201 may execute a computer program stored in the memory 212 to perform various actions described to be performed by the controller 201 in this specification.

In some embodiments, the controller 201 controls a receiving mechanism (not shown) to receive a semiconductor device 205 and load the semiconductor device 205 onto the device holder 204. The receiving mechanism may be a robotic arm.

In some embodiments, the semiconductor device 205 may be formed on a wafer. Loading the semiconductor device 205 onto the device holder 204 is equivalent to load the wafer onto the device holder 204. The wafer often includes a reference notch. After the wafer is loaded on the device holder 204, the reference notch of the wafer always appears at a pre-determined position of the device holder 204, thereby ensuring the semiconductor device 205 on the wafer is always placed at a pre-determined position. The semiconductor device 205 includes a test key. Because the semiconductor device 205 is always placed at the pre-determined position, after the semiconductor device 205 is loaded onto the device holder 204, an orientation and a position of the test key are also fixed with respect to the device holder 204.

In some embodiments, the test probe 203 includes one or more auxiliary pins, and the test key of the semiconductor device includes one or more auxiliary pads. The controller 201 controls the driving mechanism 202, the test probe 203, and the device holder 204 to obtain an alignment signal between the one or more auxiliary pins and the one or more auxiliary pads.

In some embodiments, obtaining the alignment signal between the one or more auxiliary pins of the test probe 203 and the one or more auxiliary pads of the test key of the semiconductor device 205 further comprises: performing a vertical alignment between the one or more auxiliary pins of the test probe 203 and the one or more auxiliary pads of the test key of the semiconductor device 205, and gradually reducing a vertical distance between the one or more auxiliary pins of the test probe 203 and the one or more auxiliary pads of the test key of the semiconductor device 205 for bringing into an electrical contact until the alignment signal there-between satisfies an alignment condition.

In some embodiments, the test probe further includes a plurality of test pins, and the test key of the semiconductor device further includes a plurality of test pads respectively corresponding to the plurality of test pins. The one or more auxiliary pins are arranged separate from the plurality of test pins. In a process of controlling the test probe and the test key to align with each other, even if the one or more auxiliary pins fail to align with the one or more auxiliary pads, the one or more auxiliary pins are not shifted into an expected position of any of the plurality of test pins that are aligned. In some embodiment, the one or more auxiliary pins are often arranged around the plurality of test pins. Similarly, the one or more auxiliary pads are arranged separate from the plurality of test pads. In the process of controlling the test probe and the test key to align with each other, even if the one or more auxiliary pads fail to align with the one or more auxiliary pins, the one or more auxiliary pads are not shifted into an expected position of any of the plurality of test pads that are aligned. In some embodiment, the one or more auxiliary pads are often arranged around the plurality of test pads. Thus, the alignment signal between the one or more auxiliary pins and the one or more auxiliary pads will not appear at any of the plurality of the test pins or the plurality of test pads.

On the other hand, the one or more auxiliary pins of the test probe and the one or more auxiliary pads of the test key are arranged, such that an alignment between the one or more auxiliary pins of the test probe and the one or more auxiliary pads of the test key ensures an alignment between the plurality of test pins of the test probe and the plurality of auxiliary pads of the test key.

Figure 4:
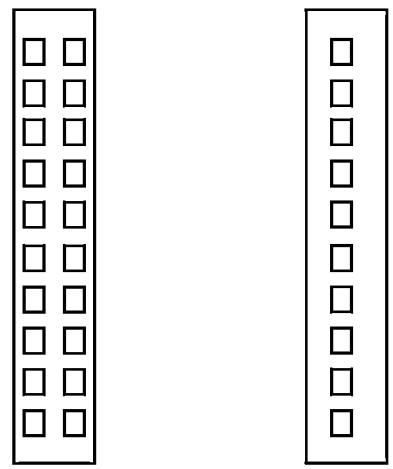
FIG. 4 is a schematic diagram of test pads of an exemplary test key according to some embodiments of the present disclosure.

FIG. 4 is a schematic diagram of test pads of an exemplary test key according to some embodiments of the present disclosure. In some embodiments, as shown in FIG. 4, the test key includes one column of test pads or two columns of test pads. In some other embodiments, the plurality of test pads may be arranged differently.

Figure 5:
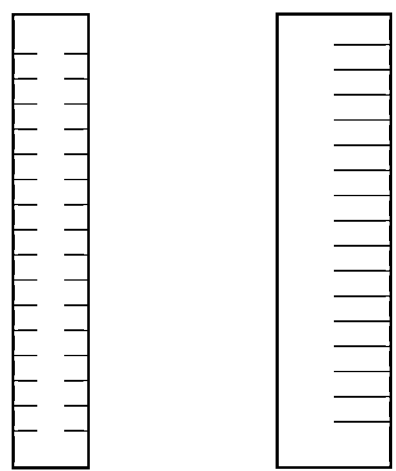
FIG. 5 is a schematic diagram of test pins of an exemplary test probe according to some embodiments of the present disclosure.

FIG. 5 is a schematic diagram of test pins of an exemplary test probe according to some embodiments of the present disclosure. In some embodiments, as shown in FIG. 5, the test probe 203 includes one column of test pins or two columns of test pins. In some other embodiments, the plurality of test pins may be arranged differently.

Figure 1B:
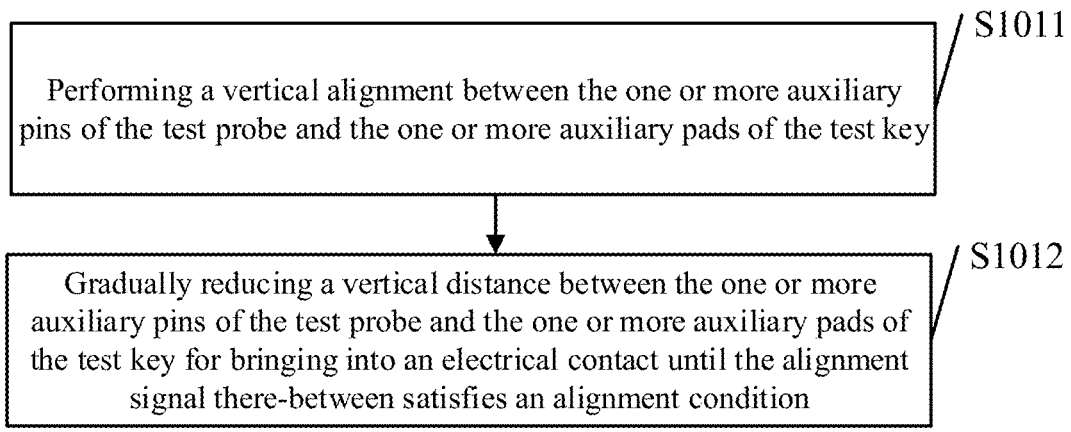
FIG. 1B is a schematic flowchart of an exemplary method for obtaining an alignment signal according to some embodiments of the present disclosure.

FIG. 1B is a schematic flowchart of an exemplary method for obtaining an alignment signal according to some embodiments of the present disclosure. As shown in FIG. 1B, at S1011, a vertical alignment between the one or more auxiliary pins of the test probe and the one or more auxiliary pads of the test key is performed.

In some embodiments, as shown in FIG. 2, the test probe 203 is mounted on the driving mechanism 202 of the testing apparatus 200. The controller 201 controls the driving mechanism 202 to perform the vertical alignment between the one or more auxiliary pins of the test probe 203 and the one or more auxiliary pads of the test key of the semiconductor device 205.

Figure 3:
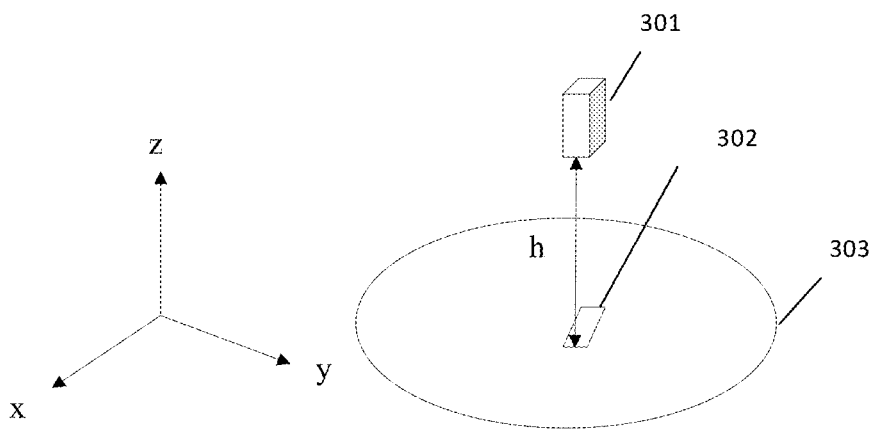
FIG. 3 is a schematic diagram showing relative positions of a test probe and a test key according to some embodiments of the present disclosure.

FIG. 3 is a schematic diagram showing relative positions of a test probe 301 and a test key 302 on a wafer 303 according to some embodiments of the present disclosure. In some embodiments, as shown in FIG. 3, after the test probe 301 is moved to a reference position, an orthogonal projection of the one or more auxiliary pins on the wafer 303 overlaps with the one or more auxiliary pads of the test key of the semiconductor device 205 on the wafer 303. In other words, each of the one or more auxiliary pins vertically align with each of the one or more auxiliary pads correspondingly. At this point, the test probe 301 and the test key 302 are vertically aligned and are separated by a vertical distance h.

In some embodiments, the test probe 203 may include a camera (not shown) pointing at the test key of the semiconductor device 205. By processing images or videos captured by the camera, the controller 201 may determine whether the test probe 203 reaches the reference position.

In some embodiments, the test probe 203 may include a laser alignment device (not shown) aiming at the test key of the semiconductor device 205. The controller 201 may control the laser alignment device to detect the one or more auxiliary pads of the test key of the semiconductor device 205 to determine whether the test probe 203 reaches the reference position.

In some embodiments, coordinates of the reference position may be inputted into the testing apparatus 200 in advance, and the controller 201 controls the driving mechanism 202 to move the test probe 203 to the coordinates of the reference position.

Returning to FIG. 1B, at S1012, a vertical distance between the one or more auxiliary pins of the test probe and the one or more auxiliary pads of the test key is gradually reduced for bringing into an electrical contact until the alignment signal there-between satisfies an alignment condition.

In some embodiments, the controller 201 controls at least one of the driving mechanism 202 or the device holder 204 to gradually reduce the vertical distance between the one or more auxiliary pins of the test probe 203 and the one or more auxiliary pads of the test key of the semiconductor device 205 for bringing into an electrical contact until the alignment signal there-between satisfies the alignment condition In some embodiments, referring to FIG. 2, the controller 201 controls the at least one of the driving mechanism 202 or the device holder 204 to gradually reduce the vertical distance between the test probe 203 and the test key of the semiconductor device 205 to make the one or more test auxiliary pins contact the one or more auxiliary pads of the test key, respectively. At the same time, the controller 201 controls the test probe 203 to obtain the alignment signal through the one or more auxiliary pins and determines whether the alignment signal satisfies the alignment condition. After the controller 201 determines that the alignment signal satisfies the alignment condition, the one or more auxiliary pins of the test probe 203 are determined to be aligned with the corresponding one or more auxiliary pads of the test key. At this time, the alignment between the test probe 203 and the test key of the semiconductor device 205 is achieved, and the controller 201 stops the at least one of the driving mechanism 202 or the device holder 204 from moving further.

Figure 6:
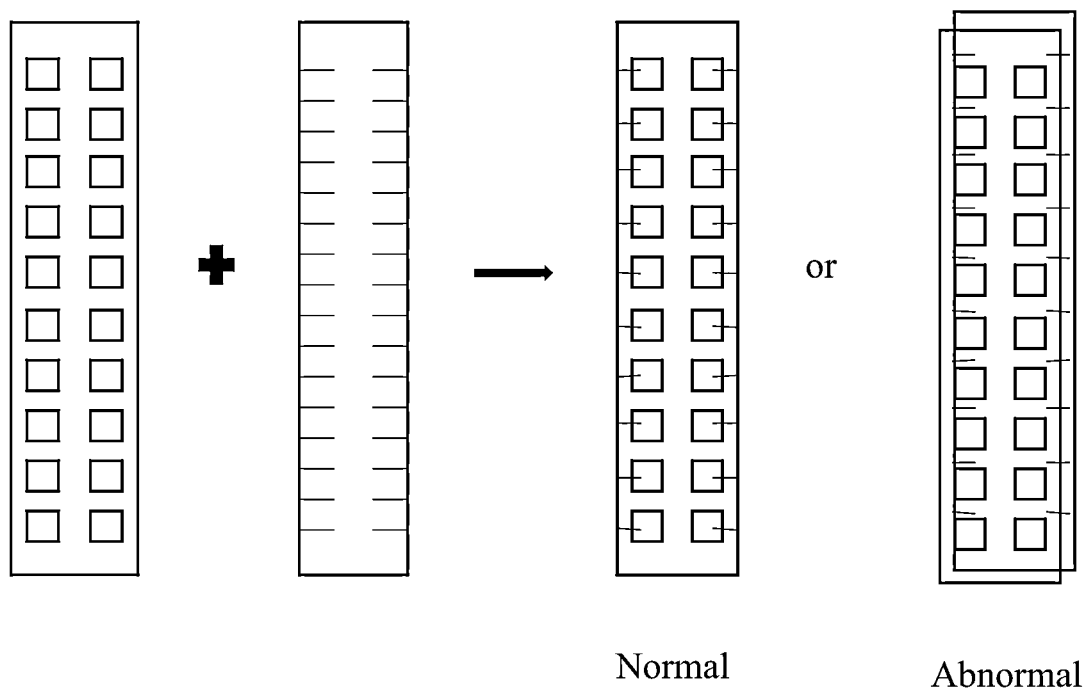
FIG. 6 is a schematic diagram showing alignment between test pins and test pads according to some embodiments of the present disclosure.

FIG. 6 is a schematic diagram showing alignment between test pins and test pads according to some embodiments of the present disclosure. As shown in FIG. 6, when the test probe and the test key are aligned with each other, the plurality of test pins of the test probe is aligned with the corresponding plurality of test pads of the test key. When the test probe and the test key are not aligned with each other, the plurality of test pins of the test probe are not aligned with the corresponding plurality of test pads of the test key. To prevent test signals from damaging the semiconductor device, the controller cannot use any of the plurality of test pins of the test probe to check for alignment between the test probe and the test key of the semiconductor device.

Figure 7:
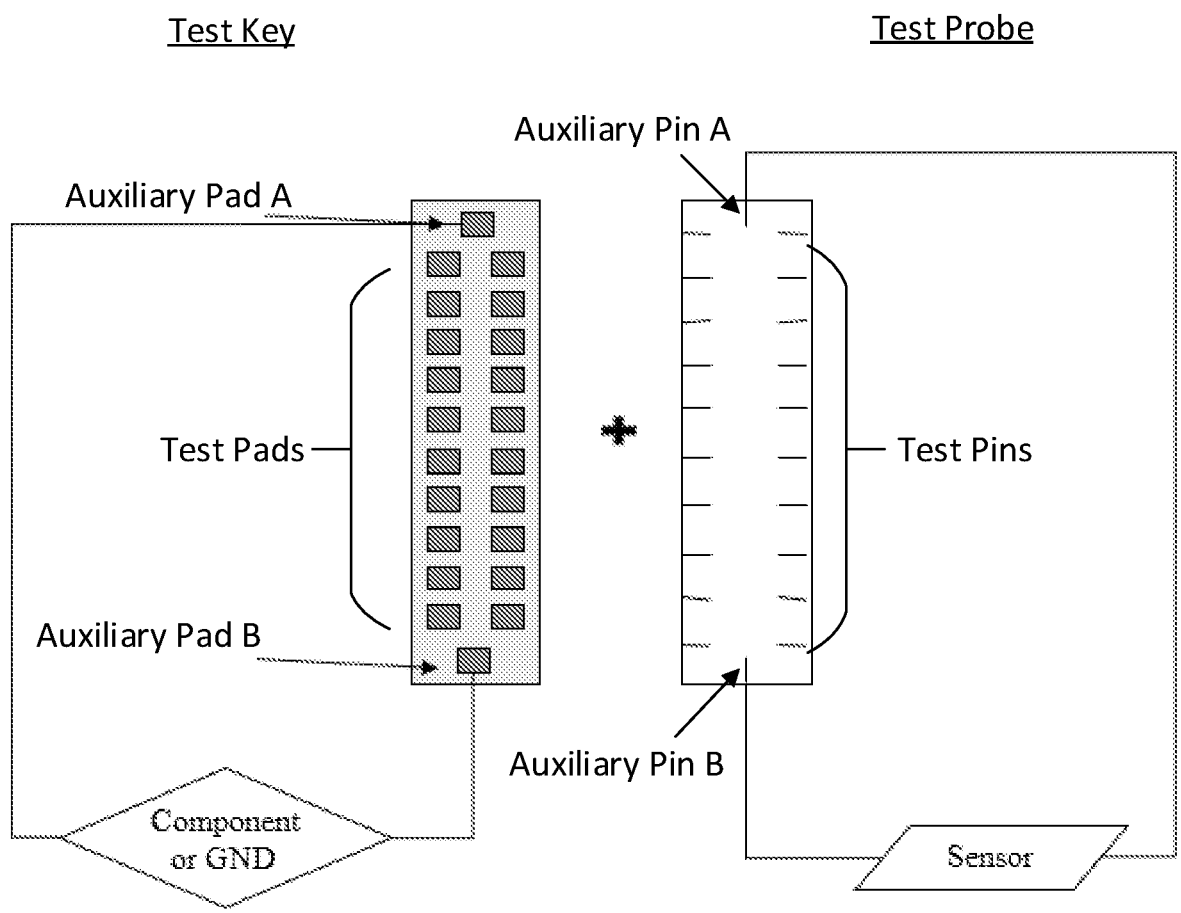
FIG. 7 is a schematic diagram showing alignment between auxiliary pins and auxiliary pads according to some embodiments of the present disclosure.

FIG. 7 is a schematic diagram showing alignment between auxiliary pins and auxiliary pads according to some embodiments of the present disclosure. In some embodiments, as shown in FIG. 7, the test probe includes two exemplary auxiliary pins: auxiliary pinA and auxiliary pinB, separated from test pins on the test probe. The test key includes two exemplary auxiliary pads: auxiliary padA and auxiliary padB corresponding to the auxiliary pinA and auxiliary pinB, respectively. The test probe further includes a sensor circuit to retrieve the alignment signal from the auxiliary pinA and pinB. After the test probe and the test key are aligned with each other, the auxiliary pinA and pinB are electrically connected to the auxiliary padA and padB, respectively, and the sensor circuit of the test probe retrieves the alignment signal between the auxiliary padA and padB. In some embodiments, the auxiliary padA and padB may be connected to a component or a ground of the semiconductor device. In some other embodiments, one of the auxiliary padA and padB may be connected to the component of the semiconductor device, and another of the auxiliary padA and padB may be grounded.

In some embodiments, the controller 201 retrieves the alignment signal from the sensor circuit and determines whether the alignment signal is within a pre-determined range or matches a pre-determined pattern.

In some embodiments, the alignment signal includes a measurement of a resistance, a capacitance, or an inductance of the semiconductor device.

In some embodiments, the alignment signal includes a measurement of an alternating current (AC) signal or a direct current (DC) signal of the semiconductor device.

In some embodiments, the alignment signal includes a digital code.

In some embodiments, because the alignment signal between the one or more auxiliary pins of the test probe 203 and the one or more auxiliary pads of the test key of the semiconductor device 205 indicates an alignment between the plurality of test pins of the test probe 203 and the plurality of test pads of the test key of the semiconductor device 205, the alignment signal satisfying the alignment condition means that the plurality of test pins of the test probe 203 respectively aligns with the plurality of test pads of test key of the semiconductor device 205.

In some embodiments, after the controller 201 determines that the alignment signal satisfies the alignment condition, the controller 201 controls the test probe 203 to perform a probing test of the semiconductor device 205 through the plurality of test pins and the plurality of test pads that are electrically connected with each other.

In some embodiments, after the controller 201 controls the at least one of the driving mechanism 202 or the device holder 204 to reduce the vertical distance between the test probe 203 and the test key of the semiconductor 205 to zero, the controller 201 fails to determine that the alignment signal satisfies the alignment condition. In this case, the controller 201 may perform a re-alignment process between the test probe 203 and the test key of the semiconductor device 205 by adjusting a position of the test probe 203 relative to the test key of the semiconductor device to increase the alignment signal until the alignment signal satisfies the alignment condition. In addition, the controller 201 may display a status indicating whether the testing apparatus 200 is performing the re-alignment process and/or send an alert notification to alert an operator of the testing apparatus 200. Correspondingly, the operator may take actions to remedy alignment failure.

In some embodiments, the controller 201 of the testing apparatus 200 controls the driving mechanism 202 to move the test probe 203 to vertically align the one or more auxiliary pins of the test probe 203 with the one or more test pads of the test key of the semiconductor device 205 and gradually reduce the vertical distance between the one or more auxiliary pins and the one or more auxiliary pads to obtain the alignment signal between the one or more auxiliary pins and the one or more auxiliary pads. In some other embodiments, the controller 201 may control the device holder 204 to move the semiconductor device 205 to vertically align the one or more auxiliary pads of the test key of the semiconductor device 205 with the one or more test pins of the test probe 203 and gradually reduce the vertical distance between the one or more auxiliary pins and the one or more auxiliary pads to obtain the alignment signal between the one or more auxiliary pins and the one or more auxiliary pads. Further, the test probe 203 and the test key of the semiconductor device 205 may be aligned in different manners. The present disclosure does not limit exact physical movement to achieve the alignment between the test probe 203 and the test key of the semiconductor device 205. Regardless how the alignment between the test probe 203 and the test key of the semiconductor 205 is physically achieved, the controller 201 determines whether the alignment signal obtained from the auxiliary pins of the test probe satisfies the alignment condition.

Returning to FIG. 1A, at S103, the probing test of the semiconductor device is performed through the plurality of test pins of the test probe that is electrically connected to the plurality of test pads of the test key of the semiconductor device.

In some embodiments, the controller 201 controls the test probe 203 to perform the probing test of the semiconductor device on the wafer only after the alignment between the test probe 203 and the test key of the semiconductor device 205 is verified. Thus, potential damage of the semiconductor device 205 by the test signals from misaligned test probe 203 can be avoided.

In some embodiments, the semiconductor device 205 is formed on the wafer. In some other embodiments, the semiconductor device 205 may be mounted on a printed circuit board (PCB) and the one or more auxiliary pads may be printed on the PCB. The present disclosure does not limit an application environment of the semiconductor device 205.

The present disclosure also provides an apparatus for testing the semiconductor device. The apparatus for testing the semiconductor device can be the testing apparatus 200 shown in FIG. 2. The controller 201 of the testing apparatus 200 controls the testing apparatus 200 to perform the method for testing the semiconductor device as described in the method embodiments. For the operation of the testing apparatus 200, reference can be made to the embodiments of the testing method. The detail description thereof is omitted herein.

The present disclosure also provides a non-transitory computer-readable storage medium. The non-transitory computer-readable storage medium stores a computer program. For example, the non-transitory computer-readable storage medium can be the memory 212 shown in FIG. 2, and the computer program may be executed by the processor 211 shown in FIG. 2. When being executed by a processor of a controller, the computer program implements the embodiments of the method for testing the semiconductor device shown in FIG. 1A and FIG. 1B. The description thereof is omitted herein.

The non-transitory computer-readable storage medium may be an internal storage unit of the device described in any of the foregoing embodiments. For example, the non-transitory computer-readable storage medium may be a hard disk or an internal memory of the device. The non-transitory computer-readable storage medium may also be an external storage device of the device, such as a plug-in hard disk, a smart media card (SMC), a secure digital (SD) card, a flash card, etc. Further, the non-transitory computer-readable storage medium may also include an internal storage unit and the external storage device. The non-transitory computer-readable storage medium may also store the computer program, and other programs and data required by the device. The non-transitory computer-readable storage medium may also temporarily store already outputted data or to-be-outputted data.

Those skilled in the art should understand that all or part of the processes in the foregoing method embodiments can be implemented by instructing relevant hardware through a computer program. The computer program may be stored in the non-transitory computer-readable storage medium, and when being executed, the computer program implements the processes of the foregoing method embodiments. The storage medium may be a magnetic disk, an optical disk, a read-only memory (ROM), or a random-access memory (RAM).

In the embodiments of the present disclosure, testing the semiconductor device on the wafer is only performed after the alignment between the test probe and the test key is confirmed by determining that the alignment signal satisfies the alignment condition. Thus, the semiconductor device on the wafer is prevented from being damaged by the test signals from the misaligned test probe.

The foregoing embodiments describe in detail the objective, the technical solution, and the beneficial effect of the present disclosure. The foregoing embodiments are only some of the embodiments of the present disclosure, which should not be used to limit the scope of present disclosure. Therefore, changes, equivalent replacements, and modifications made according to the claims of the present disclosure still fall within the scope of the present disclosure.

What is claimed is:

1. A method for testing a semiconductor device, comprising:
providing an alignment signal between one or more auxiliary pins of a test probe and one or more auxiliary pads of a test key of the semiconductor device by:
performing a vertical alignment between the one or more auxiliary pins of the test probe and the one or more auxiliary pads of the test key, and
gradually reducing a vertical distance between the one or more auxiliary pins of the test probe and the one or more auxiliary pads of the test key for bringing into an electrical contact, thereby providing the alignment signal, wherein a vertical distance between a plurality of test pins, separated from the one or more auxiliary pins, on the test probe and a plurality of test pads, separated from the one or more auxiliary pads, on the test key is also gradually reduced; and after the alignment signal obtained based on the electrical contact between the one or more auxiliary pins and the one or more auxiliary pads is verified satisfying an alignment condition required by a probing test of the semiconductor device, performing the probing test by electrically connecting the plurality of test pins on the test probe with the plurality of test pads on the test key, based on the alignment signal obtained between the one or more auxiliary pins and the one or more auxiliary pads, wherein satisfying the alignment condition includes that the alignment signal is within a pre-determined range or matching a pre-determined code pattern;

wherein:

the test probe further includes a circuit to retrieve the alignment signal; and the alignment signal includes a measurement of a resistance, a capacitance, or an inductance of the semiconductor device; the alignment signal includes a measurement of an alternating current (AC) signal or a direct current (DC) signal of the semiconductor device; or the alignment signal includes a digital code.

2. The method according to claim 1, wherein:

the one or more auxiliary pins are located around the plurality of test pins on the test probe; and the one or more auxiliary pads are located around the plurality of test pads on the test key.

3. The method according to claim 1, further comprising:

in response to the vertical distance being reduced to zero and the alignment signal failing to satisfy the alignment condition, stopping reduction of the vertical distance and performing a re-alignment process between the test probe and the semiconductor device.

4. The method according to claim 3, wherein the re-alignment process between the test probe and the semiconductor comprises:

adjusting a position of the test probe relative to the test key to increase the alignment signal until the alignment signal satisfies the alignment condition.

5. The method according to claim 1, wherein:

the vertical alignment between the one or more auxiliary pins of the test probe and the one or more auxiliary pads of the test key refers to that an orthogonal projection of the one or more auxiliary pins on a plane where the test key is located overlaps with the one or more auxiliary pads of the test key.

6. The method according to claim 1, wherein:

the plurality of test pins is arranged to correspond to the plurality of test pads, respectively;

the one or more auxiliary pins include a first auxiliary pin disposed at one end of the plurality of test pins and a second auxiliary pin disposed at another end of the plurality of test pins;

the one or more auxiliary pads include a first auxiliary pad disposed at one end of the plurality of test pads corresponding to the first auxiliary pin and a second auxiliary pad disposed at another end of the plurality of test pads corresponding to the second auxiliary pin; and an alignment between the first auxiliary pin and the first auxiliary pad and an alignment between the second auxiliary pin and the second auxiliary pad lead to an alignment between the plurality of test pins and the plurality of test pads.

7. An apparatus for testing a semiconductor device, comprising:

a controller configured to obtain an alignment signal between a test probe and the semiconductor device before a probing test of the semiconductor device, wherein the controller is configured, through a driving mechanism of the test probe and/or a device holder for holding and moving the semiconductor device, to cause:

a vertical alignment between one or more auxiliary pins of the test probe and one or more auxiliary pads of a test key of the semiconductor device; and a gradual reduction of a vertical distance between the one or more auxiliary pins and the one or more auxiliary pads for bringing into an electrical contact for providing the alignment signal, wherein a vertical distance between a plurality of test pins, separated from the one or more auxiliary pins, on the test probe and a plurality of test pads, separated from the one or more auxiliary pads, on the test key is also gradually reduced; and a performing of the probing test by electrically connecting the plurality of test pins with the plurality of test pads, based on the alignment signal between the one or more auxiliary pins and the one or more auxiliary pads, after the alignment signal obtained based on the electrical contact between the one or more auxiliary pins and the one or more auxiliary pads is verified satisfying an alignment condition, wherein an alignment circuit to retrieve the alignment signal through the one or more auxiliary pins and the one or more auxiliary pads, wherein: the alignment signal satisfying the alignment condition comprises that the alignment signal retrieved by the alignment circuit is within a pre-determined range or matches a pre-determined code pattern; and the alignment signal includes a measurement of a resistance, a capacitance, or an inductance of the semiconductor device; a measurement of an alternating current (AC) signal or a direct current (DC) signal of the semiconductor device; or a digital code.

8. The apparatus according to claim 7, wherein:

the one or more auxiliary pins are located around the plurality of test pins on the test probe; and the one or more auxiliary pads are located around the plurality of test pads on the test key.

9. The apparatus according to claim 7, further comprising:

a detector configured to detect whether the vertical distance is reduced to zero, wherein, after the detector detects that the vertical distance is reduced to zero and the alignment signal fails to satisfy the alignment condition, the controller is further configured to stop reduction of the vertical distance and perform a re-alignment process between the test probe and the semiconductor device.

10. The apparatus according to claim 7, wherein:

the controller is further configured to perform the re-alignment process between the test probe and the semiconductor by adjusting a position of the test probe relative to the test key to increase the alignment signal until the alignment signal satisfies the alignment condition.

11. The apparatus according to claim 7, wherein:
the vertical alignment between the one or more auxiliary pins of the test probe and the one or more auxiliary pads of the test key refers to that an orthogonal projection of the one or more auxiliary pins on a plane where the test key is located overlaps with the one or more auxiliary pads of the test key.

12. The apparatus according to claim 7, wherein:
the plurality of test pins is arranged to correspond to the plurality of test pads, respectively;
the one or more auxiliary pins include a first auxiliary pin disposed at one end of the plurality of test pins and a second auxiliary pin disposed at another end of the plurality of test pins;
the one or more auxiliary pads include a first auxiliary pad disposed at one end of the plurality of test pads corresponding to the first auxiliary pin and a second auxiliary pad disposed at another end of the plurality of test pads corresponding to the second auxiliary pin; and
an alignment between the first auxiliary pin and the first auxiliary pad and an alignment between the second auxiliary pin and the second auxiliary pad lead to an alignment between the plurality of test pins and the plurality of test pads.

13. A non-transitory computer-readable storage medium storing a computer program that, when being executed, cause a controller for testing a semiconductor device to:
obtain an alignment signal between a test probe and the semiconductor device before a probing test of the semiconductor device, wherein the controller is configured, through a driving mechanism of the test probe and/or a device holder for holding and moving the semiconductor device, to cause:
a vertical alignment between one or more auxiliary pins of the test probe and one or more auxiliary pads of a test key of the semiconductor device;
a gradual reduction of a vertical distance between the one or more auxiliary pins and the one or more auxiliary pads for bringing into an electrical contact for providing the alignment signal, wherein a vertical distance between a plurality of test pins, separated from the one or more auxiliary pins, on the test probe and a plurality of test pads, separated from the one or more auxiliary pads, on the test key is also gradually reduced; and
a performing of the probing test by electrically connecting the plurality of test pins with the plurality of test pads, based on the alignment signal between the one or more auxiliary pins and the one or more auxiliary pads,
after the alignment signal obtained based on the electrical contact between the one or more auxiliary pins and the one or more auxiliary pads is verified satisfying an alignment condition,
wherein satisfying the alignment condition includes that the alignment signal is within a pre-determined range or matching a pre-determined code pattern;
wherein:
the test probe further includes a circuit to retrieve the alignment signal; and
the alignment signal includes a measurement of a resistance, a capacitance, or an inductance of the semiconductor device; the alignment signal includes a measurement of an alternating current (AC) signal or a direct current (DC) signal of the semiconductor device; or the alignment signal includes a digital code.

14. The non-transitory computer-readable storage medium according to claim 13, wherein the processor is further configured to cause:
in response to the vertical distance being reduced to zero and the alignment signal failing to satisfy the alignment condition, a stop of reduction of the vertical distance and perform a re-alignment process between the test probe and the semiconductor device.

15. The non-transitory computer-readable storage medium according to claim 14, wherein the processor is further configured to cause:
an adjustment of a position of the test probe relative to the test key to increase the alignment signal until the alignment signal satisfies the alignment condition.

16. The non-transitory computer-readable storage medium according to claim 13, wherein:
the vertical alignment between the one or more auxiliary pins of the test probe and the one or more auxiliary pads of the test key refers to that an orthogonal projection of the one or more auxiliary pins on a plane where the test key is located overlaps with the one or more auxiliary pads of the test key.

* * * * *